(12) United States Patent
Wu

(10) Patent No.: US 12,190,975 B2
(45) Date of Patent: Jan. 7, 2025

(54) ADAPTIVE DSP GENERATION OF READ THRESHOLDS FOR GAUSSIAN AND NON-GAUSSIAN DISTRIBUTIONS IN SOLID STATE STORAGE USING CUMULATIVE OBSERVED COUNTS

(71) Applicant: Beijing Tenafe Electronic Technology Co., Ltd., Beijing (CN)

(72) Inventor: Yingquan Wu, Palo Alto, CA (US)

(73) Assignee: Beijing Tenafe Electronic Technology Co., Ltd. (CN)

( * ) Notice: Subject to any disclaimer, the term of this patent is extended or adjusted under 35 U.S.C. 154(b) by 361 days.

(21) Appl. No.: 17/737,781

(22) Filed: May 5, 2022

(65) Prior Publication Data

US 2022/0328121 A1 Oct. 13, 2022

Related U.S. Application Data

(63) Continuation of application No. 17/223,807, filed on Apr. 6, 2021, now Pat. No. 11,355,216.

(51) Int. Cl.
*G11C 29/42* (2006.01)
*G11C 16/10* (2006.01)
(Continued)

(52) U.S. Cl.
CPC .............. *G11C 29/42* (2013.01); *G11C 16/10* (2013.01); *G11C 16/26* (2013.01); *G11C 29/12005* (2013.01); *G11C 29/44* (2013.01)

(58) Field of Classification Search
CPC .......... G11C 2211/5644; G11C 16/349; G11C 29/12005; G11C 29/021; G11C 29/028
See application file for complete search history.

(56) References Cited

U.S. PATENT DOCUMENTS 8,923,062 B1 12/2014 Lee
9,240,245 B1 1/2016 Bellorado
(Continued)

FOREIGN PATENT DOCUMENTS

CN 102623050 8/2012
CN 107094370 8/2017
(Continued)

OTHER PUBLICATIONS

Cai et al., Data Retention in MLC NAND Flash Memory: Characterization, Optimization, and Recovery, 2015, pp. 551-563.
(Continued)

*Primary Examiner* — Uyen Smet
(74) *Attorney, Agent, or Firm* — Van Pelt, Yi & James LLP

(57) ABSTRACT

A level count disparity is determined based at least in part on: (1) an expected count of a plurality of cells in solid state storage and (2) an observed count of the plurality of cells in the solid state storage, where the observed count is associated with a number of cells in the solid state storage that are activated by performing a single read on the solid state storage using a previous read threshold. A next read threshold is determined, including by: determining a direction relative to the previous read threshold based at least in part on the level count disparity and independent of the second and earlier level count disparity; and determining a magnitude based at least in part on the level count disparity and the second and earlier level count disparity. Read data is obtained using the next read threshold and error correction decoding is performed.

12 Claims, 6 Drawing Sheets

(51) Int. Cl.
  *G11C 16/26* (2006.01)
  *G11C 29/12* (2006.01)
  *G11C 29/44* (2006.01)

(56) References Cited

U.S. PATENT DOCUMENTS

| | | | |
|---|---|---|---|
| 9,595,320 B2 | 3/2017 | Wu | |
| 2011/0044101 A1* | 2/2011 | Chou | G11C 16/34 365/189.05 |
| 2011/0161775 A1 | 6/2011 | Weingarten | |
| 2013/0229867 A1* | 9/2013 | Tang | G06F 11/1068 365/185.2 |
| 2013/0297988 A1 | 11/2013 | Wu | |
| 2014/0010009 A1* | 1/2014 | Chilappagari | G11C 11/5642 365/185.2 |
| 2019/0043588 A1 | 2/2019 | Fisher | |
| 2019/0043589 A1 | 2/2019 | Kwok | |

FOREIGN PATENT DOCUMENTS

| | | |
|---|---|---|
| CN | 108986867 | 12/2018 |
| CN | 111104528 | 5/2020 |

OTHER PUBLICATIONS

Cai et al., Error Patterns in MLC NAND Flash Memory: Measurement, Characterization, and Analysis, 2012.
Cai et al., Program Interference in MLC NAND Flash Memory: Characterization, Modeling, and Mitigation, 2013, pp. 123-130.
Cai et al., Threshold Voltage Distribution in MLC NAND Flash Memory: Characterization, Analysis, and Modeling, 2013, pp. 1-6.
Peleato et al., Adaptive Read Thresholds for NAND Flash, IEEE Transactions on Communications, Sep. 2015, vol. 63, No. 9, pp. 3069-3081.

* cited by examiner

|  | $\Theta_i^{(t)}$ | $\Theta_i^{(t)} + \Delta$ | $\Theta_i^{(t)} + 2\Delta$ | $\Theta_i^{(t)} + 3\Delta$ | $\Theta_i^{(t)} + 4\Delta$ |
|---|---|---|---|---|---|
| 502 — # of Cells Read as On (State Level $L_i$ or Lower) | 1817 | 1932 | 2118 | 2292 | 2558 |
| 504 — $c_i^{(j)}$ (Adjacent Difference Count) | | $c_i^{(1)} = 115$ | $c_i^{(2)} = 186$ | $c_i^{(3)} = 174$ | $c_i^{(4)} = 266$ |

⟵ 500

|  | $\Theta_i^{(t)}$ | $\Theta_i^{(t)} - \Delta$ | $\Theta_i^{(t)} - 2\Delta$ | $\Theta_i^{(t)} - 3\Delta$ |
|---|---|---|---|---|
| 512 — # of Cells Read as On (State Level $L_i$ or Lower) | 1817 | 1686 | 1537 | 1321 |
| 514 — $c_i^{(j)}$ (Adjacent Difference Count) | | $c_i^{(-1)} = -131$ | $c_i^{(-2)} = -149$ | $c_i^{(-3)} = -216$ |

ADAPTIVE DSP GENERATION OF READ THRESHOLDS FOR GAUSSIAN AND NON-GAUSSIAN DISTRIBUTIONS IN SOLID STATE STORAGE USING CUMULATIVE OBSERVED COUNTS

CROSS REFERENCE TO OTHER APPLICATIONS

This application is a continuation of U.S. patent application Ser. No. 17/223,807 entitled ADAPTIVE DSP GENERATION OF READ THRESHOLDS FOR GAUSSIAN AND NON-GAUSSIAN DISTRIBUTIONS IN SOLID STATE STORAGE USING CUMULATIVE OBSERVED COUNTS filed Apr. 6, 2021 which is incorporated herein by reference for all purposes.

BACKGROUND OF THE INVENTION

In some types of solid state storage (e.g., NAND Flash storage), data is stored in cells by incrementally injecting predetermined amounts of electric charge in the floating-gate of a special type of transistor. After programing (i.e., writing) a memory cell, the floating-gate gradually loses its charge over time (e.g., due to charge de-trapping and oxide leakage, more generally referred to as data retention noise). In some cases (e.g., solid state storage with longer retention times, higher storage temperature, and higher program/erase (PE) cycle counts which exacerbate the data retention noise), the number of errors in the read data may exceed the error correction capability of the code applied to the stored data. The selection of a better, non-default/non-initial voltage threshold (sometimes referred to herein as the read threshold) used to read back the data from solid state storage may reduce the number of errors in the read data so that it is within the error correction capability of the code. However, existing techniques to select or otherwise generate a read threshold assume an underlying Gaussian distribution (which is not always the case), have undesirably long latencies, and/or have other impractical requirements or limitations. New techniques to select or otherwise generate a better, non-default/non-initial read threshold which overcome these issues would be desirable.

BRIEF DESCRIPTION OF THE DRAWINGS

Various embodiments of the invention are disclosed in the following detailed description and the accompanying drawings.

FIG. 5 is a diagram illustrating an embodiment of adjacent count differences which are used in tracking aggregation.

DETAILED DESCRIPTION

Figure 1:
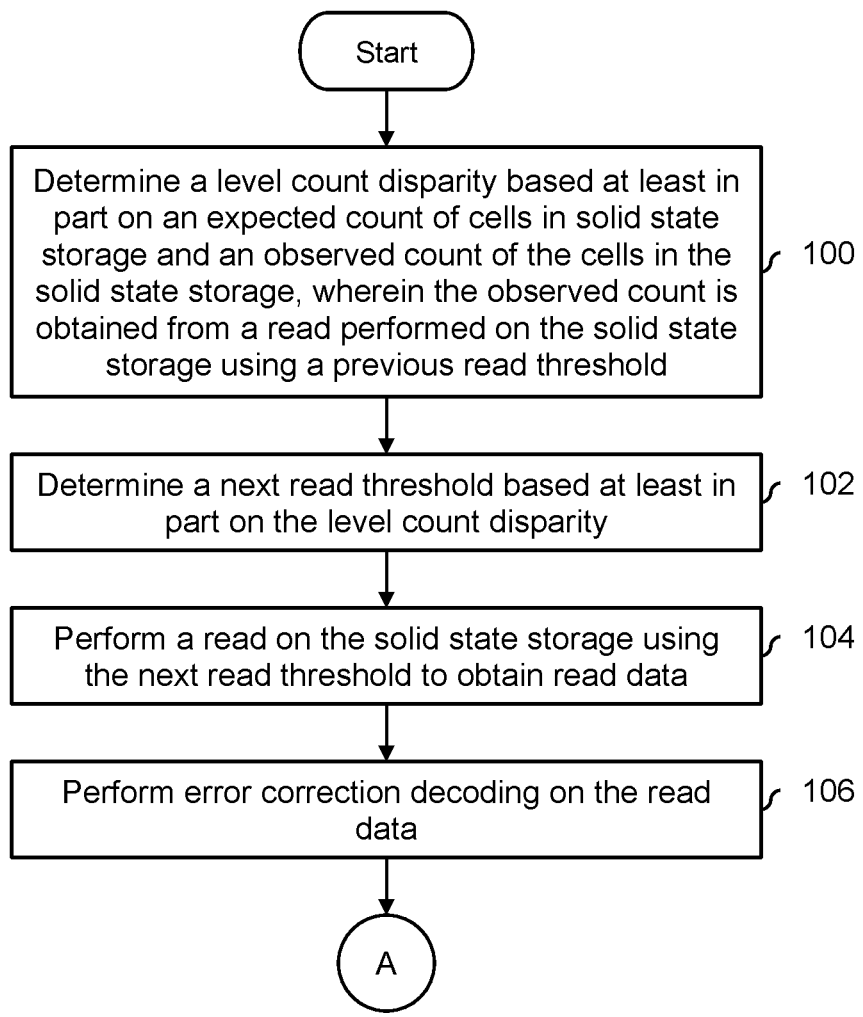
FIG. 1 is a flowchart illustrating an embodiment of a process to read back data from solid state storage, including by determining a next read threshold.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Various embodiments of a technique to determine a next read threshold to obtain or otherwise output decoded data are described herein. In some embodiments, this technique includes determining a level count disparity based at least in part on an expected count of cells in solid state storage and an observed count of the cells in the solid state storage where the observed count is obtained from a read performed on the solid state storage using a previous read threshold, determining a next read threshold based at least in part on the level count disparity, performing a read on the solid state storage using the next read threshold to obtain read data, and performing error correction decoding on the read data to obtain decoded data.

For example, at the beginning of a solid state storage's lifetime, default read threshold(s) may be used to perform reads with good performance (e.g., relatively few errors in the read data that are correctable by an error correction decoder). However, as the solid state storage ages, the number of errors in the read data may increase due to wear on the memory cells (e.g., due to programming and erasing) and/or charge leakage if data is stored for a relatively long time. Determining a new, non-default read threshold may return read data with fewer errors that the error correction decoder is able to correct. The following figures describe various embodiments of this technique.

FIG. 1 is a flowchart illustrating an embodiment of a process to read back data from solid state storage, including by determining a next read threshold. In some embodiments, the process is performed by a read controller when a default or previously-used read threshold returns read data that fails error correction decoding and thus cannot be passed up to an application which requested the data from storage. For example, when solid state storage (e.g., NAND Flash storage) is new and the data stored thereon has only been retained for a relatively short amount of time, a default or initial read threshold used to read the solid state storage may be sufficient to obtain read data with few enough errors so that an error correction code (e.g., applied to the data prior to storage) is able to correct the errors in the read data. However, as the solid state storage gets older, more worn out, and/or hotter, the default or initial read threshold may return read data with too many errors for the error correction code to correct. A better, non-default and/or non-initial read threshold may be selected or generated which returns read data with fewer errors so that the error correction code is able to correct the errors and the corrected data can be output or otherwise returned. In some embodiments, that is the context for and/or application of the exemplary process described in FIG. 1.

At 100, a level count disparity (e.g., $D_i^{(t)}$) is determined based at least in part on an expected count of cells in solid state storage and an observed count of the cells in the solid state storage, wherein the observed count is obtained from a read performed on the solid state storage (e.g., a read at a $t^{th}$ iteration or count) using a previous read threshold (e.g., $T_i^{(t)}$).

In some embodiments, the expected count and/or observed count used at step 100 is a value associated with a sum (e.g., an expected sum, such as $E(S_i)$), and/or a cumulative observed count, such as $S_i^{(t)}$). This may be desirable in embodiments where two or more bits are stored per cell (i.e., b≥2, such as multi-level cell (MLC) storage where b=2, etc.) and multiple read thresholds are being determined. For example, performing a read with a (previous) read threshold of $T_i^{(t)}$ will turn on or otherwise activate (most) cells at or below the corresponding state level of $L_i$ and using cumulative counts does not require a second read to differentiate between cells at the different state levels and/or using cumulative counts permit the multiple read thresholds to be determined or otherwise generated independently of each other).

At 102, a next read threshold is determined based at least in part on the level count disparity. For example, this may include determining a direction of the next read threshold relative to the previous read threshold based at least in part on the level count disparity and (also) determining a magnitude of the next read threshold based at least in part on the level count disparity. In one example (which will be described in more detail below), the next read threshold (e.g., $T_i^{(t+1)}$, expressed or otherwise determined using a next offset (e.g., $\Theta_i^{(t+1)}$).

$$T_i^{(t+1)} = T_i + \Delta \Theta_i^{(t+1)}$$

where $T_i$ and $\Delta$ are fixed and/or predefined and therefore determining a next read threshold at step 102 in such embodiments includes determining a next offset (e.g., $\Theta_i^{(t+1)}$). (For clarity and to explain the exemplary process at a high level at least initially, terms will be explained and described in more detail below.)

In one example described in more detail below, the next offset (e.g., $\Theta_i^{(t+1)}$) is determined using a (first) level count disparity associated with a previous read at a $t^{th}$ iteration or count (e.g., $D_i^{(t)}$), as well as a (second) level count disparity associated with the $(t-1)^{th}$ read (e.g., $D_i^{(t-1)}$).

$$\Theta_i^{(t+1)} \leftarrow \Theta_i^{(t)} - \text{sign}\left(D_i^{(t)}\right) \cdot \alpha^{(t)} \cdot \frac{\left|\Theta_i^{(t)} - \Theta_i^{(t-1)}\right| \cdot \left|D_i^{(t)}\right|}{\left|D_i^{(t-1)}\right|}$$

where, broadly speaking, $$\alpha^{(t)} \cdot \frac{\left|\Theta_i^{(t)} - \Theta_i^{(t-1)}\right| \cdot \left|D_i^{(t)}\right|}{\left|D_i^{(t-1)}\right|}$$

is a positive value and corresponds to a magnitude or value to add or subtract from the previous offset (e.g., $\Theta_i^{(t)}$). Whether that magnitude is added or subtracted from the previous offset (and therefore whether the next offset is to the left or right of the previous offset) is dictated by sign($D_i^{(t)}$) which returns the sign of the previous offset, $D_i^{(t)}$.

It is noted that some types of solid state storage store more than one bit per cell (i.e., b≥2) and in such embodiments determining a next read threshold (e.g., offset) at step 102 includes determining multiple read thresholds (e.g., offsets). For example, whereas for the single-level cell (SLC) case where b=1 only a single next read threshold (e.g., $T_0^{(t+1)}$) is determined, for the multi-level (MLC) case where b=2, three next read thresholds are determined (e.g., $T_0^{(t+1)}$, $T_1^{(t+1)}$, and $T_2^{(t+1)}$). To express the next read threshold(s) $T_i^{(t+1)}$ and next offset(s) $\Theta_i^{(t+1)}$ more generally and/or formally, step 102 may include determining $T_i^{(t+1)}$ and/or $\Theta_i^{(t+1)}$ for i=0, . . . , $(2^b-2)$.

At 104, a read is performed on the solid state storage using the next read threshold (e.g., $T_i^{(t+1)}$) to obtain read data.

At 106, error correction decoding is performed on the read data. If error correction decoding is successful (e.g., the errors contained in the read data were within the error correction capability of the decoder), the decoded data (e.g., output or generated at step 106) is passed up to the appropriate or requesting entity or block (e.g., an application which passed down a read instruction).

In contrast with the approach described in FIG. 1, some other approaches to finding the optimal read threshold perform several reads by shifting or sweeping the read threshold in one direction (e.g., from right to left) and performing error correction decoding on each of the read data returned until the error correction decoding succeeds. The recovered data is then compared with the read outputs to find the threshold yielding the lowest BER. However, this approach requires error correction decoding to be performed which adds significantly to the read latency and/or significantly degrades the read throughput. In contrast, the exemplary process of FIG. 1 is able to determine a next read threshold without having to perform error correction decoding, which is better for read latency and read throughput.

Some other approaches to finding the optimal read thresholds assume underlying Gaussian distributions for the voltages or charge levels of cells in the various state levels. For example, one technique assumes a Gaussian distribution and uses progressive reads to estimate the mean and variance of the assumed Gaussian distributions from which an optimal read threshold is then estimated or otherwise determined (e.g., the voltage at which adjacent, assumed Gaussian distributions intersect each other). This assumption of a Gaussian distribution is not always a good assumption upon which to generate a next or new read threshold. For example, if the data has been stored for a long time (i.e., high retention times) in solid state storage, the distributions are not likely to be Gaussian-like. Also, some of these techniques perform two reads at the very tail of the assumed Gaussian distribution (e.g., to enable a tractable solution for the mean and variance estimates) which may be problematic because the part of the distribution that is believed to be the tail may not behave very tail-like (e.g., because the distribution is not actually Gaussian and/or because of the small sample size).

It may be helpful to walk through the process of FIG. 1 using a specific example. The following figure shows a single-level cell (SLC) NAND Flash example to illustrate how the process of FIG. 1 may be performed (at least in some embodiments).

Figure 2:
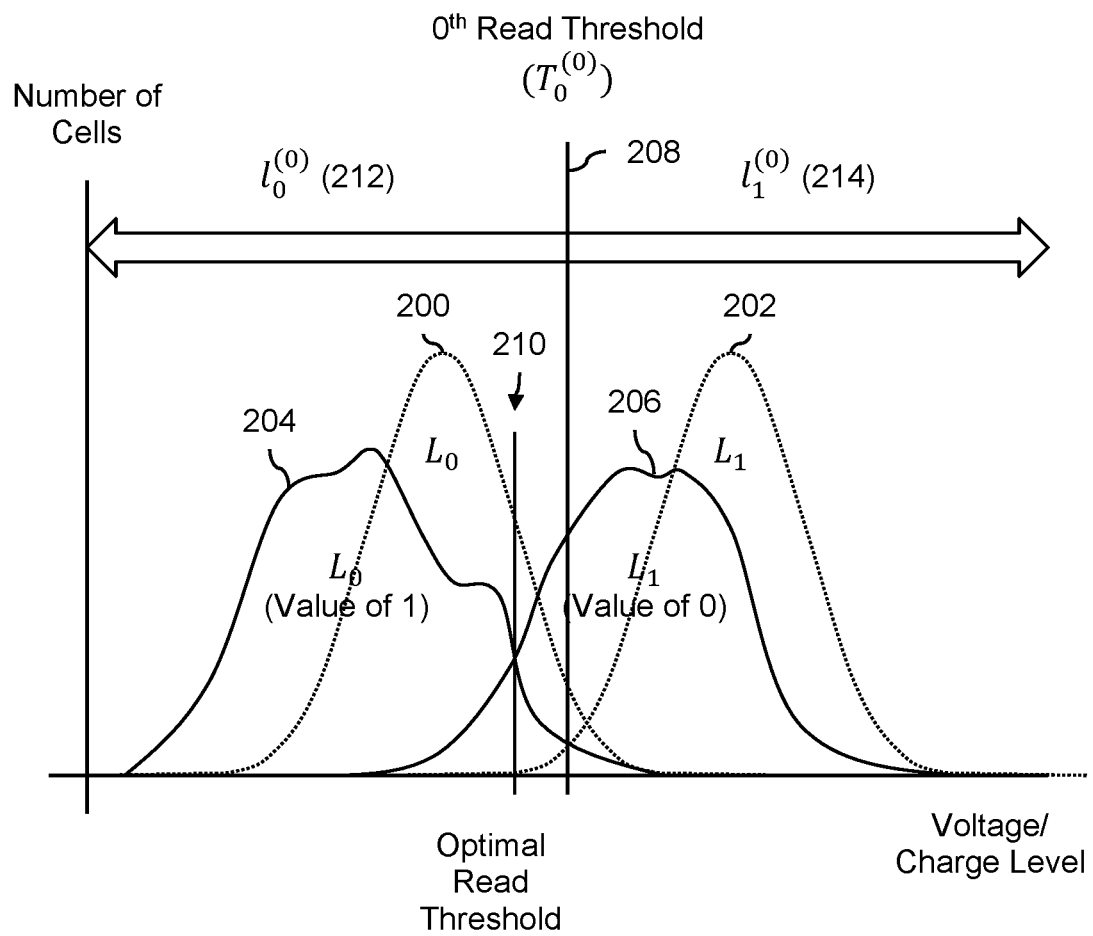
FIG. 2 is a diagram illustrating an embodiment of distributions associated with the state levels in single-level cell (SLC) NAND Flash storage.

FIG. 2 is a diagram illustrating an embodiment of distributions associated with the state levels in single-level cell (SLC) NAND Flash storage. For simplicity and ease of explanation, an SLC example is shown where the number of (information) bits (b) stored in each cell is 1 (i.e., b=1). Although this example shows an SLC example, the techniques described herein are not limited to SLC embodiments and may be extended to other types of storage (e.g., multi-level cell (MLC) storage where b=2, triple-level cell (TLC) storage where b=3, quad-level cell (QLC) storage where b=4, and so on).

In this SLC example where b=1, there are two state levels: $L_0$ (e.g., the cells that were written or programmed to hold a first, lower amount of charge) and $L_1$ (e.g., the cells that were written or programmed to hold a second, higher amount of charge). For example, cells are written or otherwise programmed to be at a particular state level by incrementally injecting predetermined amounts of electric charge in the floating-gate of a special type of transistor. In general, if b bits are stored per cell, the state levels are $\{L_i\}$, where $i=0, 1, \ldots, (2^b-1)$. The state levels correspond to the different amounts or levels of charge stored so that $L_0$ corresponds to the least amount of charge, $L_1$ corresponds to more charge than $L_0$, and so on (e.g., assuming no noise, charge loss, etc.).

Even if cells are programmed or written to be at the same state level, the cells with hold slightly different amounts of charge. As such, the state levels are shown here as distributions. For example, the cells associated with the $L_0$ distributions (200 and 204) were all programmed to be at the first state level (i.e., $L_0$) and the cells associated with the $L_1$ distributions (202 and 206) were all programmed to be at the second state level (i.e., $L_1$). Some other read threshold generation techniques assume a Gaussian distribution, in which case the state level distributions would resemble Gaussian $L_0$ distribution (200) and the Gaussian $L_1$ distribution (202). In the real world (e.g., depending upon data retention noise, data retention time, storage temperature, the wear on the storage (e.g., program/erase (PE) cycle count), etc.) the state level distributions may be messy and/or non-Gaussian, such as non-Gaussian $L_0$ distribution (204) and the non-Gaussian $L_1$ distribution (206). In some embodiments, the distributions begin as more Gaussian-like distributions (e.g., due to shorter data retention times and less worn out cells with low program and erase counts) and decay into non-Gaussian distributions (e.g., as data retention times become longer and the cells become worn out with larger program and erase counts).

Each (e.g., read-back) state level is mapped to or interpreted as a particular (e.g., payload) number, symbol, or value. In this example, the $L_0$ state level is associated with or mapped to a value of 1 and the $L_1$ state level is associated with or mapped to a value of 0. More generally, each state level $L_i$ maps or corresponds to a value in the range 0 through $(2^b-1)$. The mapping between each value and $L_i$ state level (sometimes referred to as cell level bit mapping) is typically vendor specific and gray coding is often used to minimize the number of bit errors due to the prevalence of adjacent state level crossing errors.

As used herein, the superscript (t) denotes variables that are associated with the $t^{th}$ page read (e.g., relative to this read threshold generation technique). One such variable is the read threshold $T_0^{(0)}$ (208), which is associated with a read at the $0^{th}$ iteration (e.g., note the superscript of (0) in $T_0^{(0)}$) and that turns on or otherwise activates cells with a charge less than or equal to the read threshold $T_0^{(0)}$. As such, the cells at or below $T_0^{(0)}$ are read back as being in the $L_0$ state level (e.g., a value of 1) and the number or count of such cells with a 1 value or $L_0$ state level is $l_0^{(0)}$ (212). The other cells, with charges greater than $T_0^{(0)}$, are counted in $l_1^{(0)}$ (214). This means that cells in the non-Gaussian $L_0$ distribution (204) that are to the right of read threshold $T_0^{(0)}$ (208) will incorrectly be read as a 0 value or $L_1$ state level and cells in the non-Gaussian $L_1$ distribution (206) that are to the left of read threshold $T_0^{(0)}$ (208) will incorrectly be read as a 1 value or $L_0$ state level.

In some embodiments, one or more initial read thresholds are predefined values. For example, for the t=0 read, the read threshold(s) used at the $0^{th}$ read ($T_i^{(0)}$) may be the read thresholds from the previous read (e.g., that most recently failed error correction decoding and thus triggered this read generation process) and/or the most recent estimates of the optimal read thresholds. For the t=1 read, the read threshold(s) used (e.g., $T_i^{(1)}$) are the read threshold(s) from the t=0 read shifted left (e.g., downward) by some predefined value(s) (e.g., $T_i^{(1)} \leftarrow T_i^{(0)} - \text{<predefined value>}$). The predominant effect of retention noise is to widen and move the cell level voltage distributions to the left (i.e., downwards since retention noise tends to be dominated by charge leakage, not the addition of charge) and therefore shifting the t=0 read threshold to the left by some amount may be a good estimate for that read threshold. In one example, a predefined (down) shift of $\sigma_i$, an estimated standard deviation of the distribution of the i-th level from $T_i^{(0)}$ to $T_i^{(1)}$, is used because $\sigma_i$ is a dominant indicator of tail distribution.

Returning to the observed counts, the read using read threshold $T_0^{(0)}$ (208) produces an observed count of $l_0^{(0)}$ (212) which is the number of cells read on the $0^{th}$ read (e.g., note the superscript of (0) in $l_0^{(0)}$) as being in the $L_0$ state level (e.g., note the subscript of 0 in $l_0^{(0)}$). Similarly, the observed count $l_1^{(0)}$ (214) is the number of cells read on the $0^{th}$ read as being in the $L_1$ state level. These observed counts include read errors from cells in the non-Gaussian $L_0$ distribution (204) to the right of read threshold $T_0^{(0)}$ (208) and cells in the non-Gaussian $L_1$ distribution (206) to the left of read threshold $T_0^{(0)}$ (208). These counts (i.e., $l_0^{(0)}$ and $l_1^{(0)}$) are examples of observed counts in step 100 in FIG. 1. The read using $T_0^{(0)}$ (208) also returns or otherwise permits knowledge of the value of $l_1^{(0)}$ (214) because the cells that are not turned on or read as a value of 1 (i.e., in the $L_0$ state level) are read to be and/or by elimination have a value of 0 (i.e., in the $L_1$ state level). More generally, $l_i^{(t)}$ is the observed count of cells obtained on the $t^{th}$ read and (read as being) in the $L_i$ state level.

Returning to the topic of read thresholds, there is no need to perform a read using a read threshold with an index of $(2^b-1)$ that turns on or otherwise activates cells that are in the state level up to and including the highest state level (i.e., that turns on or otherwise activates most, if not all, cells). In the SLC example of FIG. 2, for example, a single read threshold is sufficient to differentiate between the two state levels and therefore there is no need for a read threshold of $T_1^{(0)}$ (e.g., which would read or otherwise turn on most, if not all, cells). Similarly, for an MLC embodiment where there are four state levels, only three read thresholds would be needed to differentiate between or otherwise read the four state levels and the read threshold of $T_3^{(t)}$ is unnecessary. Therefore, only read thresholds with indices in the range of 0 through $(2^b-2)$ are of interest: $\{T_i^{(t)}\}$ where i=0, . . . , $(2^b-2)$.

The goal in determining a next read threshold (e.g., at step 102 in FIG. 1) is to determine a read threshold that is close(r) to the optimal read threshold (210). The optimal read threshold corresponds to the voltage or charge level at which two adjacent distributions (e.g., the non-Gaussian $L_0$ and $L_1$ distributions (204 and 206)) cross each other and is the read threshold that produces the minimum number of errors. As will be described in more detail below, the process of FIG. 1 may be conceptually thought of as a gradient descent process that does not assume an underlying Gaussian distribution (which is an assumption that does not always hold) nor does it require error correction decoding (which is relatively time consuming and adds significantly to the total read latency) to be performed in order for the next read threshold to be generated.

In this example, all read thresholds, such as a previous read threshold (e.g., $T_i^{(t)}$) or a next read threshold (e.g., $T_i^{(t+1)}$), are limited to be a value from a set of predefined or permitted values. For example, some solid state systems have fixed or predefined read thresholds that are associated with a particular state level and are referred to herein as target (voltage) thresholds ($T_i$). These target thresholds cannot be changed or otherwise adjusted by the user and may be conceptually thought of as default thresholds. If a user wants to use a read threshold (e.g., $T_i^{(t)}$) that is not equal to the corresponding target threshold (e.g., $T_i$), some solid state storage devices permit reads using incremental offsets relative to the fixed target threshold. In some such embodiments, a read threshold (e.g., $T_i^{(t)}$) is expressed as:

$$T_i^{(t)} = T_i + \Delta \Theta_i^{(t)}$$

where $T_i$ is the (e.g., fixed and/or predefined) target threshold, $\Delta$ is the (e.g., fixed and/or predefined) smallest voltage increment supported by the solid state storage, and $\Theta_i^{(t)}$ is a scalar parameter referred to herein as a threshold offset (e.g., which is variable). The example currently being described has this configuration and therefore attempts to find or otherwise determines the next threshold offset ($\Theta_i^{(t+1)}$) that is equivalent to determining the next read threshold ($T_1^{(t+1)}$). As described above, read thresholds with an index of $(2^b-1)$ are not of interest so $\{T_i\}$ where i=0, . . . , $(2^b-2)$ and $\{\Theta_i^{(t)}\}$ where i=0, . . . , $(2^b-2)$.

Returning to FIG. 1, step 100 also uses an expected number of cells in addition to an observed number of cells. In this example, the expected number of cells in each state level (sometimes referred to herein as the expected count) is the length of the read (data) (e.g., n) divided by the number of state levels (e.g., $2^b$). For example, if a word-line in SLC storage is being read, $E(l_0)$ would be the length of a word-line divided by two since there are only two state levels: $L_0$ and $L_1$. During the write and/or encoding process, a scrambling process is (often) performed on the data which produces evenly distributed values to be stored (e.g., an equal distribution or number of 0s and 1s to store for SLC storage). As a result, in many applications it is safe to assume that in SLC storage, half of the bits read back should be a 1 value (i.e., an $L_0$ state level) and half of the bits should be a 0 value (i.e., an $L_1$ state level). $E(l_i)$ is sometimes referred to herein as an expected count (e.g., the expected value of the number of cells in the $L_i$ state level).

Before describing an example of how the level count disparity (e.g., $D_i^{(t)}$ and/or the preceding $D_i^{(t-1)}$) can be determined at step 100 in FIG. 1, it would be helpful to first define some other terms or variables. $S_i^{(t)}$ is referred to herein as the cumulative observed count and is the sum of the number of cells observed in (or read back as) state levels up to and including state level $L_i$. By definition:

$$S_i^{(t)} \triangleq \sum_{j=0}^{i-1} l_j^{(t)}$$

where by definition $S_0$, and therefore $S_0^{(t)}$, equals 0 and $l_j^{(t)}$ is the observed count associated with the $j^{th}$ state level (e.g., $L_j$) at the $t^{th}$ read. We observe that the number of thresholds is $2^b-1$, corresponding to $S_i$, i=1, 2, . . . , $2^b-1$, respectively. For the SLC example shown in FIG. 2 where b=2 and t=0, $S_0^{(0)}=0$ and $S_1^{(0)}=l_0^{(0)}$. The table below shows example cumulative observed counts for MLC storage where b=2 and there are four state levels.

TABLE 1

Example of cumulative observed counts ($S_i^{(t)}$) for MLC storage.

|  |  | $l_0^{(t)}$ | $l_1^{(t)}$ | $l_2^{(t)}$ |
|---|---|---|---|---|
| $S_0^{(t)}$ | $S_0^{(t)} = 0$ | — | — | — |
| $S_1^{(t)}$ | $S_1^{(t)} = l_0^{(t)}$ | | — | — |
| $S_2^{(t)}$ | $S_2^{(t)} = l_0^{(t)} + l_1^{(t)}$ | | | — |
| $S_3^{(t)}$ | $S_3^{(t)} = l_0^{(t)} + l_1^{(t)} + l_2^{(t)}$ | | | |

It is noted that each cumulative observed count in the above table corresponds to the (e.g., observed) cells that are turned on or activated by a particular read threshold. That is, $S_i^{(t)}$ only depends on (e.g., can be obtained solely from) $T_{i-1}^{(t)}$ and no other read thresholds. For example, for $S_1^{(t)}$, the cells counted in $l_0^{(t)}$ are all turned on and can be counted solely using the read threshold $T_0^{(t)}$. For $S_2^{(t)}$, the cells counted in $l_0^{(t)}$ and in $l_1^{(t)}$ are all turned on and can be counted with just the read threshold $T_1^{(t)}$ and so on. It some cases (e.g., for storage where b≥2) it may be more convenient to deal with cumulative observed counts instead of the $l_i^{(t)}$ counts because a cumulative observed count can be obtained from a single read using a single read threshold (e.g., for a single state level). It may also be useful to eliminate the dependence on other read thresholds for other state levels, since those other read thresholds may (also) be in the process of being adjusted or otherwise refined to find a next, better read threshold for those state levels and it is desirable for the read threshold generation processes to be independent of each other.

The expected value of the sum ($E(S_i)$), sometimes referred to herein as the expected sum, is $E(S_i)=\sum_{j=0}^{i-1} E(l_j)$. As described above, it is assumed that there is a scrambler in the write and/or encoding path to evenly distribute the values that are stored and/or state levels that cells are in and therefore the expected sum assumes a uniform distribution. The following table shows example expected sums ($E(S_i)$) for MLC storage.

TABLE 2

Example of expected sums (E(S$_i$)) for MLC storage.

| | — | E(l$_0$) | E(l$_1$) | E(l$_2$) |
|---|---|---|---|---|
| E(S$_0$) | E(S$_0$) = 0 (0) | — | — | — |
| E(S$_1$) | | E(S$_1$) = E(l$_0$) (n/4) | — | — |
| E(S$_2$) | | E(S$_2$) = E(l$_0$) + E(l$_1$) (n/2) | | — |
| E(S$_3$) | | E(S$_3$) = E(l$_0$) + E(l$_1$) + E(l$_2$) (3n/4) | | |

In the above table, n is the number of read or measured cells and it is assumed scrambling is (e.g., perfectly) uniform. For example, if a word-line is read then n equals the length of a word-line.

The level count disparity ($D_i^{(t)}$) (e.g., determined at step 100 in FIG. 1) is defined to be the cumulative observed count ($S_i^{(t)}$) minus the expected sum (E(S$_i$)):

$$D_i^{(t)} \triangleq S_i^{(t)} - E(S_i)$$

Assuming that the scrambler perfectly and uniformly distributes the stored values or state levels amongst n cells, the following can be said about the expected sum (E(S$_i$)) and the associated standard deviation ($\sigma^2(S_i)$):

$$E(S_i) = \sum_{j=0}^{i-1} \frac{n}{2^b} = \frac{ni}{2^b}$$

$$\sigma^2(S_i) = ni2^{-b}(1 - 2^{-b})$$

When determining the read offset ($\Theta_i^{(t+1)}$) for t≥2, the following is used:

$$\Theta_i^{(t+1)} \leftarrow \Theta_i^{(t)} - \text{sign}\left(D_i^{(t)}\right) \cdot \alpha^{(t)} \cdot \frac{\left|\Theta_i^{(t)} - \Theta_i^{(t-1)}\right| \cdot \left|D_i^{(t)}\right|}{\left|D_i^{(t-1)}\right|},$$

where {$\alpha^{(t)}$} is a positive dampening sequence, such as $$\frac{1}{t}$$

which may be desirable in some applications because without one the iterations may oscillate.

As described above, determining the next threshold offset (e.g., $\Theta_i^{(t+1)}$) is equivalent (at least in this example) to determining the next read threshold (e.g., $T_i^{(t+1)}$) where $T_i^{(t+1)} = T_i + \Delta\Theta_i^{(t+1)}$. In the above equation, sign($D_i^{(t)}$) returns the sign of $D_i^{(t)}$ and therefore determines whether the (t+1)$^{th}$ read offset (and correspondingly, the read threshold) is to the left or right of the t$^{th}$ read offset (and correspondingly, the read threshold). The positive value $$\alpha^{(t)} \cdot \frac{\left|\Theta_i^{(t)} - \Theta_i^{(t-1)}\right| \cdot \left|D_i^{(t)}\right|}{\left|D_i^{(t-1)}\right|}$$

specifies how much to the left or right of the previous read offset ($\Theta_i^{(t)}$) the next read offset ($\Theta_i^{(t+1)}$) will be. In other words, determining the next read threshold includes determining an offset of the next read threshold (e.g., relative to the previous read threshold) based at least in part on the level count disparity (e.g., $D_i^{(t)}$) and a second and older level count disparity (e.g., $D_i^{(t-1)}$) and determining whether to add or subtract the offset from the previous read threshold based at least in part on the sign of the level count disparity. Generally speaking, this is like a gradient descent, where the process attempts to go down the slope of the distribution.

It is noted that the exemplary technique to determine or otherwise generate a next read threshold described above does not assume an underlying Gaussian distribution, does not require lengthy error correction decoding, and does not require reads in a specific part of the distribution (e.g., does not require a read in the tail). For these reasons, this exemplary technique may produce better results (e.g., because it does not assume a Gaussian distribution where none exists) and/or may return results faster than some other techniques (e.g., because it does not perform error correction decoding, which can take a relatively long time).

Returning briefly to the process of FIG. 1, in some embodiments, hard-decision error correction decoding is performed at step 106. The following figure shows an example block diagram of a solid state storage system that performs the exemplary process of FIG. 1, including hard decoding at step 106.

Figure 3:
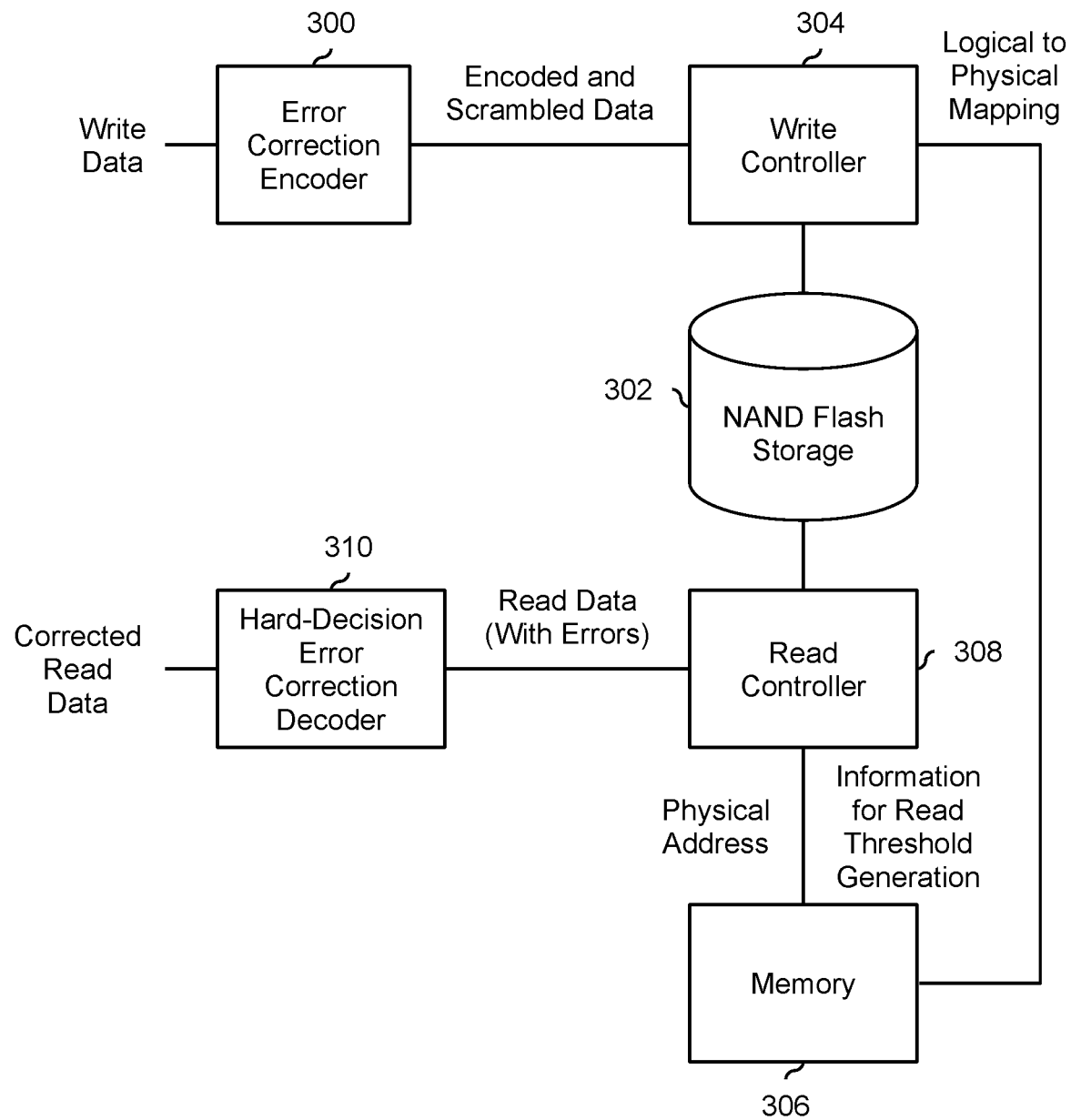
FIG. 3 is a block diagram illustrating an embodiment of a solid state storage system with read thresholds generated using gradient descent and hard-decision error correction decoding, if needed.

FIG. 3 is a block diagram illustrating an embodiment of a solid state storage system with read thresholds generated using gradient descent and hard-decision error correction decoding, if needed. In this example, write data to be stored is passed to an error correction encoder (300), for example, from an application that wants to store data on the solid state storage, which in this example is NAND Flash storage (302). The encoder (300) applies an error correction code to the write data and performs scrambling (e.g., to evenly distribute the stored values or cell state levels) and outputs encoded and scrambled data which is passed to a write controller (304). The write controller stores the encoded and scrambled data at some physical address in the NAND Flash storage and associates or otherwise maps the physical address with the logical address. This mapping information is stored in memory (306) which is shared by and/or accessible to both the write controller (304) and the read controller (308).

To retrieve the stored data (e.g., in response to a read request directed to the logical address), the read controller (308) accesses the shared memory (306) to determine the physical address associated with the logical address. In this example, the read controller will initially read the NAND Flash storage (302) at the looked-up physical address using one or more default, initial, and/or previous read threshold(s), such as the target thresholds (T$_i$). In this example, the read data (e.g., obtained using the default, initial, and/or previous read threshold(s)) has so many errors that the hard-decision error correction decoder (310) is unable to correct the read data and thus cannot output corrected read data (e.g., to the application). For example, the NAND Flash storage (302) may be relatively old with a high program and erase count and/or the data may have been stored in the NAND Flash storage for a relatively long time.

In response to the failure by the hard-decision error correction decoder (310) to decode the read data, the read controller (308) determines one or more new and/or non-default read thresholds using the process of FIG. 1 (at least in this example). As described above, the process of FIG. 1 to determine a new and/or non-default read threshold may use previous read thresholds that were attempted and/or counts that are obtained by reading the solid state storage using various read thresholds and this information may be stored in the memory (306) and retrieved by the read controller (308) as/if needed. Once the next read threshold(s) is/are determined, the read threshold is used to read the appropriate physical address in the NAND Flash storage in order to obtain read data (e.g., with fewer errors and/or a different error pattern that is correctable). The (new) read data is then passed to the hard-decision error correction decoder (310) for another decoding attempt and if decoding is successful, the corrected read data is output (e.g., to the application that issued the read instruction or request). If not, the process (e.g., of FIG. 1) may be repeated (e.g., until some predefined limit or maximum number of attempts stops the process of FIG. 1).

In this example, the decoder (310) is a hard-decision error correction decoder (sometimes referred to herein as a hard decoder) as opposed to a soft-decision error correction decoder (sometimes referred to herein as a soft decoder). Although soft decoders are able to decode some errors that hard decoders are not able to decode, they tend to take longer. As such, in this example, a hard decoder is used (e.g., first). The following figure describes a similar system where if hard decoding of the read data obtained using the gradient descent technique described above continues to fail for some number of attempts, a second technique (e.g., tracking aggregation) is then used to determine new and/or next read thresholds and soft decoding is performed on the read data.

Figure 4:
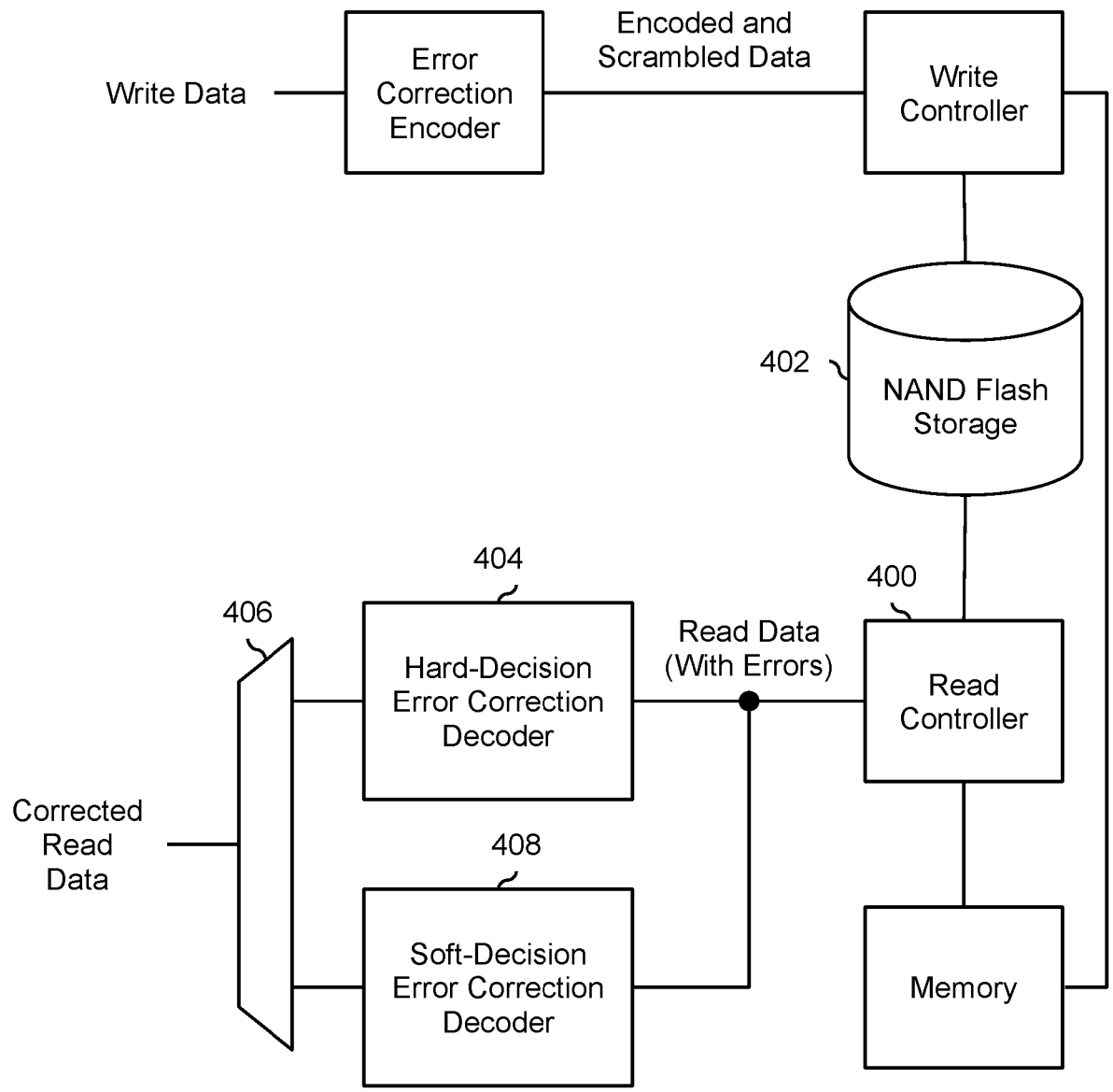
FIG. 4 is a block diagram illustrating an embodiment of a solid state storage system with read thresholds generated using tracking aggregation and soft-decision error correction decoding, if needed.

FIG. 4 is a block diagram illustrating an embodiment of a solid state storage system with read thresholds generated using tracking aggregation and soft-decision error correction decoding, if needed. FIG. 4 is similar to FIG. 3 and for brevity some blocks are not described herein. As with the example of FIG. 3, the read controller (400) begins by reading the NAND Flash storage (402) using default, initial, and/or previous read threshold(s), such as the target threshold(s) ($T_i$) and this read data is decoded using the hard decoder (404). If either the hard decoder (404) or the soft decoder (408) is successful at any time, the multiplexer (406) selects the output from the successful decoder and outputs it as corrected read data (e.g., to the application that issued the read instruction or read request).

If the hard decoder (404) fails to decode the read data obtained using the initial, default, and/or previous read threshold(s), the read controller (400) generates one or more new read threshold(s) using a gradient descent approach, as described above. As described in the example above, the t=0 and t=1 read threshold(s) are predefined and the read data from those reads are not error corrected. Instead, the t=0 and t=1 read data are used to generate the next read threshold(s) per the gradient descent example described above. Hard decoding is, however, performed on the read data obtained using read thresholds (offsets) generated via the gradient descent technique described above. The gradient descent generated read threshold(s) and hard decoder are given a predefined and/or fixed number of attempts to successfully output corrected read data but in some other embodiments a different limit or maximum number of attempts is used.

TABLE 3

Example sequence of read threshold generation and error correction decoding combinations attempted by the system of FIG. 4.

| Read Threshold Generation Technique | Error Correction Decoding |
|---|---|
| Initial, default, and/or previous read threshold(s) | Hard decision |
| Predefined read threshold(s) (e.g., part of gradient descent process) | N/A |
| Gradient descent | Hard decision |
| Predefined ascending and descending sequence around the last gradient descent threshold(s) (e.g., part of tracking aggregation process) | Hard decision |
| Tracking aggregation | Soft decision |

If the maximum number of attempts is reached, the read controller (400) switches to an aggregate tracking technique to generate the next read threshold(s) (e.g., expressed as offset(s)). To do that, the read controller (400) reads near the last read threshold(s) generated using gradient descent. More specifically, the reads are done at increments of $\Delta$ around the last read threshold (offset) generated by the gradient descent technique. Let $\{\Theta_i^{(t)}\}$ for i=0, 1, 2, . . . , ($2^b-2$) be the most recent read offset(s) generated using gradient descent and the nearby reads are performed along the following two sequences to the right and left, respectively, of that most recent read (threshold) offset(s):

$$\Theta_i^{(t)}, \Theta_i^{(t)}+\Delta, \ldots, \Theta_i^{(t)}+(v_1-1)\Delta, \Theta_i^{(t)}+v_1\Delta$$

$$\Theta_i^{(t)}, \Theta_i^{(t)}-\Delta, \ldots, \Theta_i^{(t)}-(v_2-1)\Delta, \Theta_i^{(t)}+v_2\Delta$$

where i=0, 1, 2, . . . , ($2^b-2$), $\Delta$ (as described above) is the smallest voltage increment supported by the solid state storage, and $v_1$ and $v_2$ are positive integers that are dynamically determined (this is described in more detail below). The read data from these reads is decoded by the hard decoder (404) and if decoding is successful, the decoded data is output as corrected read data and the process ends.

In this example, the number of reads around the last gradient descent generated read threshold(s) (offset(s)) is not predefined but rather is determined dynamically based on when a (stopping) condition is satisfied. In this example, the stopping condition depends upon $c_i^{(j)}$ which is the difference between the number of cells that are read as on (i.e., in the $L_i$ state level or lower) using adjacent read offsets ($\Theta_i^{(t)}+(j-1)\Delta$) and ($\Theta_i^{(t)}+j\Delta$) where the j=0 case is ignored. The following figure shows an example of adjacent count differences.

FIG. 5 is a diagram illustrating an embodiment of adjacent count differences which are used in tracking aggregation. In this example, table 500 shows adjacent count differences ($c_i^{(j)}$) associated with an increasing sequence of read offsets (e.g., $\Theta_i^{(t)}, \Theta_i^{(t)}+\Delta, \ldots, \Theta_i^{(t)}+(v_1-1)\Delta, \Theta_i^{(t)}+v_1\Delta$). In this table, the top row (502) shows the number of cells that are read as on (e.g., in a state level of $L_i$ or lower). The sequence of offsets is increasing in value so the number of cells in the top row (502) will tend to (but not always) increase.

The bottom row (504) shows the adjacent count differences between the counts from adjacent read offsets in the top row (502). In this example, the predefined threshold (magnitude) is 200 and the first time that threshold is exceeded is for $c_i^{(4)}=266$ associated with the $\Theta_i^{(t)}+3\Delta$ and $\Theta_i^{(t)}+4\Delta$ adjacent offsets. The read process would therefore stop at the $\Theta_i^{(t)}+4\Delta$ read offset (at least in that direction).

Table 510 shows the same information for the decreasing sequence of read offsets (e.g., $\Theta_i^{(t)}, \Theta_i^{(t)}-\Delta, \ldots, \Theta_i^{(t)}-(v_2-1)\Delta, \Theta_i^{(t)}-v_2\Delta$). As before, the top row (512) shows the number of cells read as on for a given offset and the bottom row (514) shows the adjacent count differences between adjacent offsets. In this case, the predefined threshold (magnitude) of 200 is exceeded sooner at $c_i^{(-3)}=-216$ associated with the $\Theta_i^{(t)}-2\Delta$ and $\Theta_i^{(t)}-3\Delta$ adjacent read offsets. The read process would therefore stop at the $\Theta_i^{(t)}-3\Delta$ read offset (at least in that direction). As described above, the j=0 case is ignored.

Returning to FIG. 5, with the exemplary adjacent difference counts shown in FIG. 5, the next read threshold (offset) is determined in this aggregate tracking example using the following inversely weighted average:

$$\Theta_i = \Theta_i^{(t)} + \max\left(\frac{\Delta}{2}, \Delta \cdot \left(\sum_{j=-v_2, j\neq 0}^{v_1} \frac{1}{c_i^{(j)} + 0.5}\right)^{-1} \cdot \left(\sum_{j=-v_2, j\neq 0}^{v_1} \frac{j}{c_i^{(j)} + 0.5}\right)\right)$$

where using a minimum of $$\frac{\Delta}{2}$$

(e.g., in me second Term) is w Trade off read noise and where $\Theta_i^{(t)}$ is the last read offset (e.g., generated by the gradient descent process if this is the first iteration of tracking aggregation, or the last offset generated by tracking aggregation if this is a second or subsequent iteration of tracking aggregation), $\Delta$ is the offset (e.g., the smallest voltage offset supported by the solid state storage system), and the range over which the summation is performed (e.g., from $-v_2$ to $v_1$) is dictated by how far up and down the increasing sequence and the decreasing sequence reads were performed. The addition of 0.5 to $c_i^{(j)}$ is to prevent precision overflow and having the minimum of the second term be at least $$\frac{\Delta}{2}$$

is to trade off read noise. The effect of the product of the two summations will depend upon which difference counts are smaller: the ones associated with the ascending sequence to the right, or the ones associated with the descending sequence going to the left. Smaller difference counts carry more weight, whereas larger adjacent difference counts carry less weight (thus it is referred to as an inversely weighted average). Intuitively or conceptually, the inversely weighted average attempts to insert more weight on reads occurred at the data distribution valley.

For example, if the values shown in FIG. 5 were used to find a next offset:

$$\Theta_i = \Theta_i^{(t)} + \max\left(\frac{\Delta}{2}, \Delta \cdot \left(\sum_{j=-v_2, j\neq 0}^{v_1} \frac{1}{c_i^{(j)} + 0.5}\right)^{-1} \cdot \left(\sum_{j=-v_2, j\neq 0}^{v_1} \frac{j}{c_i^{(j)} + 0.5}\right)\right)$$

$$\Theta_i = \Theta_i^{(t)} + \max\left(\frac{\Delta}{2}, \Delta \cdot \left(\sum_{j=-3, j\neq 0}^{4} \frac{1}{c_i^{(j)} + 0.5}\right)^{-1} \cdot \left(\sum_{j=-3}^{4} \frac{j}{c_i^{(j)} + 0.5}\right)\right)$$

-continued $$\Theta_i = \Theta_i^{(t)} +$$
$$\max\left(\frac{\Delta}{2}, \Delta \cdot \left(\frac{1}{c_i^{(-3)} + 0.5} + \cdots + \frac{1}{c_i^{(-1)} + 0.5} + \frac{1}{c_i^{(1)} + 0.5} + \cdots + \frac{1}{c_i^{(4)} + 0.5}\right)^{-1} \cdot$$
$$\left(\frac{-3}{c_i^{(-3)} + 0.5} + \cdots + \frac{-1}{c_i^{(-1)} + 0.5} + \frac{1}{c_i^{(1)} + 0.5} + \cdots + \frac{4}{c_i^{(4)} + 0.5}\right)\right)$$

and so on. As a practical matter, since $\Delta$ is the smallest voltage increment supported by the system, the next offset (or threshold) is rounded to the nearest integer multiple of $\Delta$.

Returning briefly to Table 3, the read threshold(s) (offset(s)) that are generated using tracking aggregation are soft decoded (e.g., by soft decoder 408 in FIG. 4). The combination of tracking aggregation to generate read threshold(s) (offset(s)) and soft decoding may be repeated as many times as desired until that combination is halted.

It is noted that the sequences and combinations shown in the example of Table 3 and other examples described herein are merely exemplary and are not intended to be limiting. In some other embodiments, a different sequence of combinations, a different combination, and/or a different number of attempts may be used compared to the example shown here. For example, soft decoding may be performed on read data that was obtained using gradient descent generated read threshold(s).

This example is described more formally and/or generally in the following flowchart.

Figure 6:
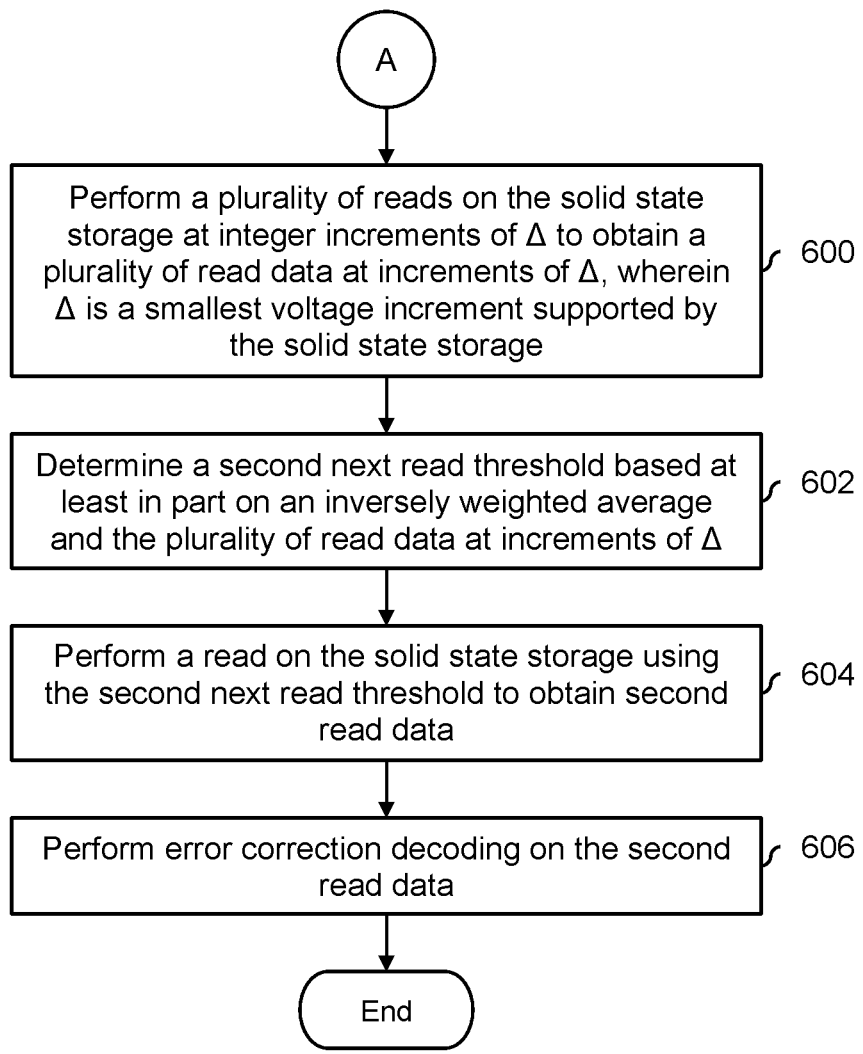
FIG. 6 is a flowchart illustrating an embodiment of a process to generate read thresholds using tracking aggregation and perform soft-decision error correction decoding on the read data, if needed.

FIG. 6 is a flowchart illustrating an embodiment of a process to generate read thresholds using tracking aggregation and perform soft-decision error correction decoding on the read data, if needed. In this example FIG. 6 continues the example of FIG. 1 (e.g., after some maximum number of attempts to generate new read threshold(s) at step 102, read at step 104, and perform error correction decoding at step 106 has been reached without success). In some embodiments, decoding at step 106 includes and/or is limited to hard decision error correction decoding.

At 600, a plurality of reads is performed on the solid state storage at integer increments of $\Delta$ to obtain a plurality of read data at increments of $\Delta$, wherein $\Delta$ is a smallest voltage increment supported by the solid state storage. See, for example, the reads performed at positive increments of $\Delta$ (e.g., to the right of the previous read threshold) in table 500 in FIG. 5 and the reads performed at negative increments of $\Delta$ (e.g., to the left of the previous read threshold) in table 510 in FIG. 5.

At 602, a second next read threshold is determined based at least in part on an inversely weighted average and the plurality of read data at increments of $\Delta$. In the example described above and shown in FIG. 5, adjacent difference counts ($c_i^{(j)}$) are determined and then those values are used in an inversely weighted average to determine a next read offset (threshold).

At 604, a read is performed on the solid state storage using the second next read threshold to obtain second read data. At 606, error correction decoding is performed on the second read data. For example, as shown in the example of Table 3, soft decoding may be performed on this read data, even though soft decoding tends to take longer than hard decoding. In this example, trying new read thresholds and the subsequent error correction decoding has failed multiple times and so the use of a soft decoder, which can take longer but is capable of decoding some errors that a hard decoder cannot, is acceptable (at least some applications).

This process shown in FIG. 6 may be repeated as or if needed until a timeout occurs or error correction decoding (either soft or hard) is successful.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
a memory that is configured to store information associated with read threshold generation, including a second and earlier level count disparity; and
a read controller that is coupled to the memory and that is configured to:
determine a level count disparity based at least in part on: (1) an expected count of a plurality of cells in solid state storage and (2) an observed count of the plurality of cells in the solid state storage, wherein the observed count is associated with a number of cells in the solid state storage that are activated by performing a single read on the solid state storage using a previous read threshold;
determine a next read threshold based at least in part on the level count disparity, including by:
determining a direction of the next read threshold relative to the previous read threshold based at least in part on the level count disparity and independent of the second and earlier level count disparity; and
determining a magnitude of the next read threshold based at least in part on the level count disparity and the second and earlier level count disparity;
perform a read on the solid state storage using the next read threshold to obtain read data, wherein error correction decoding is performed on the read data;
perform a plurality of reads on the solid state storage at integer increments of $\Delta$ to obtain a plurality of read data at increments of $\Delta$, wherein $\Delta$ is a smallest voltage increment supported by the solid state storage;
determine a second next read threshold based at least in part on an inversely weighted average and the plurality of read data at increments of $\Delta$; and
perform a read on the solid state storage using the second next read threshold to obtain second read data.

2. The system recited in claim 1, wherein determining the next read threshold is independent of an assumption that charge levels of the plurality of cells in the solid state storage have a Gaussian distribution.

3. The system recited in claim 1, further including a hard decision error correction decoder that performs hard decision error correction decoding on the read data.

4. The system recited in claim 1, further including a soft decision error correction decoder that performs soft decision error correction decoding on the read data.

5. The system recited in claim 1, further including:
a hard decision error correction decoder that performs hard decision error correction decoding on the read data; and
a soft decision error correction decoder that performs soft decision error correction decoding on the second read data.

6. The system recited in claim 1, wherein:
each of the plurality of cells is configured to store at least two bits per cell; and
the observed count includes a cumulative observed count, wherein:
the cumulative observed count is associated with a number of cells in the solid state storage that are activated by performing a single read on the solid state storage using a previous read threshold ($T_{i-1}^{(t)}$);
the cumulative observed count is independent of other read thresholds; and
the cumulative observed count includes: (1) a first number of cells ($l_0^{(t)}$) that are associated with a $0^{th}$ state level ($L_0$) and (2) a second number of cells ($l_1^{(t)}$) that are associated with a $1^{st}$ state level ($L_1$).

7. A method, comprising:
storing information associated with read threshold generation, including a second and earlier level count disparity, in a memory;
determining a level count disparity based at least in part on: (1) an expected count of a plurality of cells in solid state storage and (2) an observed count of the plurality of cells in the solid state storage, wherein the observed count is associated with a number of cells in the solid state storage that are activated by performing a single read on the solid state storage using a previous read threshold;
determining a next read threshold based at least in part on the level count disparity, including by:
determining a direction of the next read threshold relative to the previous read threshold based at least in part on the level count disparity and independent of the second and earlier level count disparity; and
determining a magnitude of the next read threshold based at least in part on the level count disparity and the second and earlier level count disparity;
performing a read on the solid state storage using the next read threshold to obtain read data, wherein error correction decoding is performed on the read data;
determining a second next read threshold, including by:
performing a plurality of reads on the solid state storage at integer increments of $\Delta$ to obtain a plurality of read data at increments of $\Delta$, wherein $\Delta$ is a smallest voltage increment supported by the solid state storage; and
determining the second next read threshold based at least in part on an inversely weighted average and the plurality of read data at increments of $\Delta$; and
performing a read on the solid state storage using the second next read threshold to obtain second read data.

8. The method recited in claim 7, wherein determining the next read threshold is independent of an assumption that charge levels of the plurality of cells in the solid state storage have a Gaussian distribution.

9. The method recited in claim 7, further including performing hard decision error correction decoding on the read data using a hard decision error correction decoder.

10. The method recited in claim 7, further including performing soft decision error correction decoding on the read data using a soft decision error correction decoder.

11. The method recited in claim 7, further including:
performing hard decision error correction decoding on the read data using a hard decision error correction decoder; and
performing soft decision error correction decoding on the second read data using a soft decision error correction decoder.

12. The method recited in claim 7, wherein:
each of the plurality of cells is configured to store at least two bits per cell; and
the observed count includes a cumulative observed count, wherein:
  the cumulative observed count is associated with a number of cells in the solid state storage that are activated by performing a single read on the solid state storage using a previous read threshold ($T_{i-1}^{(t)}$);
  the cumulative observed count is independent of other read thresholds; and
  the cumulative observed count includes: (1) a first number of cells ($l_0^{(t)}$) that are associated with a $0^{th}$ state level ($L_0$) and (2) a second number of cells ($l_1^{(t)}$) that are associated with a $1^{st}$ state level ($L_1$).

* * * * *